(12) United States Patent
Saito

(10) Patent No.: US 7,595,357 B2
(45) Date of Patent: Sep. 29, 2009

(54) VINYL ETHER CURING COMPOSITION

(75) Inventor: Seiichi Saito, Tokyo (JP)

(73) Assignee: Adeka Corporation, Tokyo (JP)

( * ) Notice: Subject to any disclaimer, the term of this patent is extended or adjusted under 35 U.S.C. 154(b) by 380 days.

(21) Appl. No.: 10/560,815

(22) PCT Filed: Jul. 15, 2004

(86) PCT No.: PCT/JP2004/010095

§ 371 (c)(1),
(2), (4) Date: Dec. 15, 2005

(87) PCT Pub. No.: WO2005/010098

PCT Pub. Date: Feb. 3, 2005

(65) Prior Publication Data

US 2006/0178454 A1    Aug. 10, 2006

(30) Foreign Application Priority Data

Jul. 24, 2003   (JP)  ............................ 2003-278953

(51) Int. Cl.
*C08K 5/51*    (2006.01)
*C08K 5/06*    (2006.01)

(52) U.S. Cl. ........................ 524/136; 524/367; 524/369; 524/378

(58) Field of Classification Search ................. 524/148; 528/86; 428/446
See application file for complete search history.

(56) References Cited

U.S. PATENT DOCUMENTS

| | | | | |
|---|---|---|---|---|
| 6,121,358 A | * | 9/2000 | Dershem et al. ............ | 524/439 |
| 6,211,320 B1 | * | 4/2001 | Dershem et al. ......... | 526/329.1 |
| 6,667,194 B1 | * | 12/2003 | Crane et al. ................. | 438/127 |
| 2001/0053820 A1 | * | 12/2001 | Yeager et al. ............... | 525/186 |
| 2002/0151106 A1 | * | 10/2002 | Noro et al. .................. | 438/118 |
| 2003/0059978 A1 | * | 3/2003 | Suzuki et al. ............... | 438/106 |

FOREIGN PATENT DOCUMENTS

| | | |
|---|---|---|
| GB | 1089871 | 11/1967 |
| JP | 05-105896 | 4/1993 |
| JP | 11-255863 | 9/1999 |
| JP | 2001-354836 | 12/2001 |
| JP | 2002-72480 | 3/2002 |
| JP | 2002-241472 | 8/2002 |
| JP | 2003-26784 | 1/2003 |
| JP | 2003-82061 | 3/2003 |
| JP | 2003-171535 | 6/2003 |

OTHER PUBLICATIONS

Machine Translation of JP 2001-354836.*
Hawley's Condensed Chemical Dictionary by Lewis, Richard J., Sr. 2002 John Wiley & Sons.*

* cited by examiner

*Primary Examiner*—Marc S Zimmer
*Assistant Examiner*—John Uselding
(74) *Attorney, Agent, or Firm*—Young & Thompson

(57) ABSTRACT

A vinyl ether curing composition is formed from a polyvalent vinyl ether compound, a polyvalent phenolic compound and a flame retardant. The composition may contain 10 to 30 parts by weight of a phosphorus-based flame retardant as the flame retardant per 100 parts by weight of the total of the polyfunctinoal vinyl ether compound and the polyhydric phenol compound. This vinyl ether curing composition allows the formation of a cured product with a low dielectric constant.

15 Claims, No Drawings

VINYL ETHER CURING COMPOSITION

TECHNICAL FIELD

The present invention relates to a vinyl ether curing composition composed of a polyfunctional vinyl ether compound and a polyhydric phenol compound. More particularly, it relates to a vinyl ether curing composition which provides a cured product with a low dielectric constant on heat curing reaction between the polyfunctional vinyl ether compound and the polyhydric phenol compound. The vinyl ether curing composition is preferably used to make prepregs used in laminates, particularly build-up laminates.

BACKGROUND ART

Heat- or photo-curing compositions containing a curing resin such as an epoxy resin are widely used as a material of laminated sheets, coatings, adhesives, photolithography, and the like. Among known curing resins are epoxy resins obtained from various epoxy compounds including aromatic epoxy compounds typified by bisphenol A diglycidyl ether; alicyclic epoxy compounds, e.g., 2,2-bis(3,4-epoxycyclohexyl)propane and 3,4-epoxycyclohexylcarbonyloxymethyl-3,4-epoxycyclohexane; and aliphatic epoxy compounds, e.g., ethylene glycol diglycidyl ether and glycidyl(meth)acrylate, and curing agents including polyamine compounds, polyhydric phenol compounds, and acid anhydrides.

In addition to the epoxy resins, photo-curing resins using dipentaerythritol hexaacrylate, etc. are also known.

In obtaining a cured product from these curing resins, it is necessary to control characteristics, such as glass transition temperature, water absorption, dielectric constant, impact strength, tensile strength, elongation in tension, and adhesion strength; and curing rate and curing conditions at the time of curing. For that purpose, the structure of compounds and the composition should be selected properly. In particular, cured products used in multilayer printed circuits are required to have a high glass transition temperature, excellent dielectric characteristics, and a low water absorption.

For laminate applications, epoxy resins enjoy broad use in view of the performance balance. Characteristics control by structural design of epoxy compounds is described, e.g., in Patent Document 1 and Patent Document 2. The publications teach that 2,2-bis(3,4-epoxycyclohexyl)propane has a high glass transition temperature and propose using the compound in photolithographic applications or laminate applications.

Patent Document 1: JP-A-5-105896
Patent Document 2: JP-A-11-255863

DISCLOSURE OF THE INVENTION

It is difficult for a cured product composed mainly of an epoxy compound and a curing agent therefor to satisfy all the required performance properties. It has been desired to provide a curing composition capable of forming a cured product with a low dielectric constant particularly in the field of laminates having seen remarkable development in fine processing technology.

Accordingly, an object of the present invention is to provide a curing composition capable of forming a cured product having, in particular, a low dielectric constant.

The present invention accomplishes the above object by providing a vinyl ether curing composition composed of a polyfunctional vinyl ether compound and a polyhydric phenol compound.

The invention provides the vinyl ether curing composition which contains 100 parts by weight of the polyfunctional vinyl ether compound, 30 to 200 parts by weight of the polyhydric phenol compound, 10 to 3000 parts by weight of a filler, and 10 to 200 parts by weight of a flame retardant.

The invention provides the vinyl ether curing composition, wherein the polyfunctional vinyl ether compound is a tetra- or higher functional vinyl ether compound.

The invention provides the vinyl ether curing composition, wherein the polyhydric phenol compound is a phenol resin represented by general formula (I):

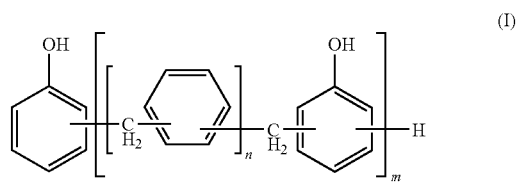

wherein n represents 0 or 1; and m represents a number of from 1 to 10000.

The invention provides the vinyl ether curing composition which contains 10 to 1000 parts by weight of silica as the filler per 100 parts by weight of the total of the polyfunctional vinyl ether compound and the polyhydric phenol compound.

The invention provides the vinyl ether curing composition which contains 10 to 50 parts by weight of a phosphorus-based flame retardant as the flame retardant per 100 parts by weight of the total of the polyfunctional vinyl ether compound and the polyhydric phenol compound.

The invention provides the vinyl ether curing composition, wherein the phosphorus-based flame retardant is a compound represented by formula (II):

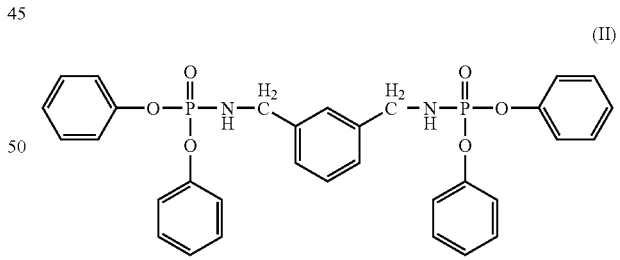

The invention provides the vinyl ether curing composition which contains a polyepoxy compound.

The invention provides a prepreg formed by using the vinyl ether curing composition.

The vinyl ether curing composition of the present invention composed of a polyfunctional vinyl ether compound and a polyhydric phenol compound provides a cured product having a low dielectric constant and enables fine patterning of multilayer printed circuits.

BEST MODE FOR CARRYING OUT THE INVENTION

The present invention will be described in detail. The term "the (present) invention" as used herein means one or more embodiments of the invention.

are preferred; for they provide a cured product having a high glass transition temperature.

Specific examples of the polyfunctional vinyl ether compounds include, but are not limited to, compound Nos. 1 to 5 shown below. In compound No. 4, n' represents a number of from 1 to 10000.

Compound No. 1:

Compound No. 2:

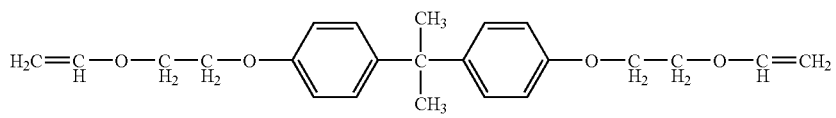

Compound No. 3:

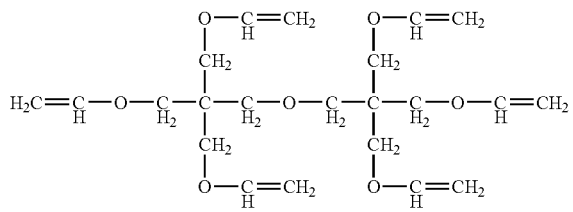

Compound No. 4:

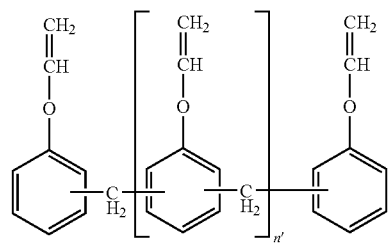

Compound No. 5:

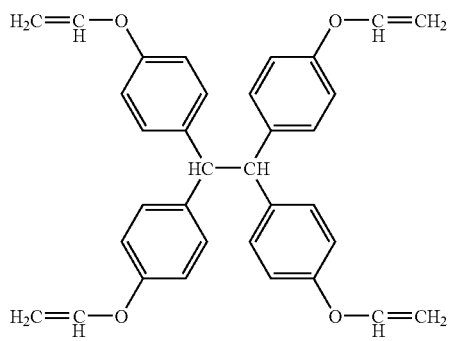

The polyfunctional vinyl ether compound that can be used in the vinyl ether curing composition of the invention includes, but is not limited to, vinyl ether derivatives of polyhydric alcohols or polyhydric phenols. Examples of the polyhydric alcohols are ethylene glycol, propylene glycol, tetramethylene glycol, neopentyl glycol, glycerol, trimethylolpropane, pentaerythritol, dipentaerythritol, 1,4-cyclohexanedimethanol, and ethylene oxide- or propylene oxide-adducts of polyhydric phenols, such as 2,2-bis(4-(2-hydroxyethyloxy)phenyl)propane. Examples of the polyhydric phenols are hydroquinone, bisphenol A, bisphenol F, bisphenol S, 1,1,2,2-tetrakis(4-hydroxyphenyl)ethane, 1,3,5-tris(4-hydroxybenzyl)-1,3,5-triazine-2,4,6-trion, 1,1,3-tris(4-hydroxyphenyl)butane, and phenolic resins, such as phenol novolak and cresol novolak. Of the polyfunctional vinyl ether compounds those having tetra- or higher functionality The polyhydric phenol compounds that can be used in the vinyl ether curing composition of the invention include hydroquinone, bisphenol A, bisphenol F, bisphenol S, 1,1,2,2-tetrakis(4-hydroxyphenyl)ethane, 1,3,5-tris(4-hydroxybenzyl)-1,3,5-triazine-2,4,6-trion, 1,1,3-tris(4-hydroxyphenyl)butane, and phenolic resins, such as phenol novolak and cresol novolak. Particularly preferred of them are phenolic resins represented by general formula (I) shown supra in view of the excellent mechanical strength of a resulting cured product.

Specific but non-limiting examples of the polyhydric phenol compounds include compound Nos. 6 through 9 shown below.

Compound No. 6:

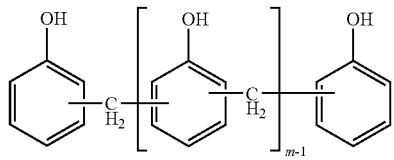

Compound No. 7:

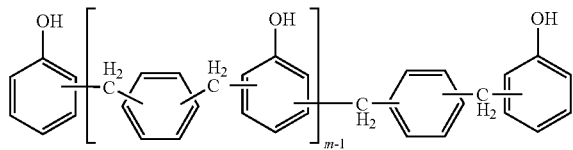

Compound No. 8:

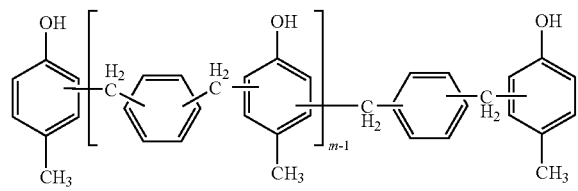

Compound No. 9:

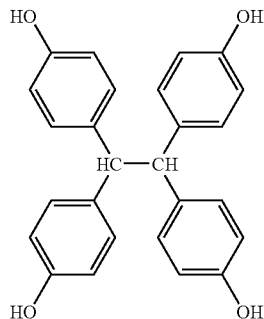

The amount of the polyhydric phenol compound in the vinyl ether curing composition is preferably 30 to 200 parts by weight, still preferably 50 to 150 parts by weight, per 100 parts by weight of the polyfunctional vinyl ether compound.

The vinyl ether curing composition of the invention preferably contains a polyepoxy compound, an epoxy resin curing agent, a filler, a flame retardant, and so forth according to necessity.

The polyepoxy compound includes aromatic epoxy compounds, alicyclic epoxy compounds, and aliphatic epoxy compounds. The aromatic epoxy compounds include glycidyl ether compounds of polyhydric phenols, such as hydroquinone, resorcinol, bisphenol A, bisphenol F, 4,4'-dihydroxybiphenyl, novolak, tetrabromobisphenol A, and 2,2-bis(4-hydroxyphenyl)-1,1,1,3,3,3-hexafluoropropane. The alicyclic epoxy compounds include polyglycidyl ethers of polyhydric alcohols having at least one alicyclic ring and cyclohexene oxide- or cyclopentene oxide-containing compounds obtained by epoxidizing cyclohexene ring- or cyclopentene ring-containing compounds with an oxidizing agent. Typical examples of the alicyclic epoxy compounds are hydrogenated bisphenol A diglycidyl ether, 2,2-bis(3,4-epoxycyclohexyl)propane, 3,4-epoxycyclohexylmethyl-3,4-epoxycyclohexylcarboxylate, 3,4-epoxy-1-methylcyclohexyl-3,4-epoxy-1-methylhexanecarboxylate, 6-methyl-3,4-epoxycyclohexylmethyl-6-methyl-3,4-epoxycyclohexanecarboxylate, 3,4-epoxy-3-methylcyclohexylmethyl-3,4-epoxy-3-methylcyclohexanecarboxylate, 3,4-epoxy-5-methylcyclohexylmethyl-3,4-epoxy-5-methylcyclohexanecarboxylate, bis(3,4-epoxycyclohexylmethyl) adipate, methylenebis(3,4-epoxycyclohexane), 2,2-bis(3,4-epoxycyclohexyl)propane, dicyclopentadiene diepoxide, ethylenebis(3,4-epoxycyclohexanecarboxylate), dioctyl epoxyhexahydrophthalate, and di-2-ethylhexyl epoxyhexahydrophthalate. The aliphatic epoxy compounds include polyglycidyl ethers of aliphatic polyhydric alcohols or alkylene oxide adducts thereof, polyglycidyl esters of aliphatic long-chain polybasic acids, vinyl polymerization homopolymers of glycidyl acrylate or glycidyl methacrylate, and vinyl polymerization copolymers of glycidyl acrylate or glycidyl methacrylate and other vinyl monomer(s). Typical examples of the aliphatic epoxy compounds include glycidyl ethers of polyhydric alcohols, such as 1,4-butanediol diglycidyl ether, 1,6-hexanediol diglycidyl ether, glycerol triglycidyl ether, trimethylolpropane triglycidyl ether, sorbitol tetraglycidyl ether, dipentaerythritol hexaglycidyl ether, polyethylene glycol diglycidyl ether, and polypropylene glycol diglycidyl ether; polyether polyol polyglycidyl ethers obtained by adding at least one kind of an alkylene oxide to an aliphatic polyhydric alcohol, e.g., propylene glycol, trimethylolpropane or glycerol; and diglycidyl esters of aliphatic long-chain dibasic acids. Further included are monoglycidyl ethers of aliphatic higher alcohols, monoglycidyl ethers of phenol, cresol, butylphenol or a polyether alcohol obtained by adding an alkylene oxide thereto, glycidyl esters of higher fatty acids, epoxidized soybean oil, octyl epoxystearate, butyl epoxystearate, and epoxidized polybutadiene.

The epoxy resin curing agent includes latent curing agents, polyamine compounds, polyphenol compounds, and cationic initiators.

The latent curing agents include dicyandiamides, hydrazides, imidazole compounds, amine adducts, sulfonium salts, onium salts, ketimines, acid anhydrides, and tertiary amines. These latent curing agents are preferred; for they provide an easy-to-handle, one-pack type curing composition.

Examples of the acid anhydrides are phthalic anhydride, trimellitic anhydride, pyromellitic anhydride, tetrahydrophthalic anhydride, hexahydrophthalic anhydride, maleic anhydride, succinic anhydride, and 2,2-bis(3,4-dicarboxyphenyl)-1,1,1,3,3,3-hexafluoropropane dianhydride.

The polyamine compounds include aliphatic polyamines, such as ethylenediamine, diethylenetriamine, and triethylenetetramine; alicyclic polyamines, such as menthenediamine, isophoronediamine, bis(4-amino-3-methylcyclohexyl)methane, bis(aminomethyl)cyclohexane, and 3,9-bis(3-aminopropyl)-2,4,8,10-tetraoxaspiro[5.5]-undecane; aliphatic amines having an aromatic ring, such as m-xylenediamine; and aromatic polyamines, such as m-phenylenediamine, 2,2-bis(4-aminophenyl)propane, diaminodiphenylmethane, diaminodiphenylsulfone, α,α-bis(4-aminophenyl)-p-diisopropylbenzene, and 2,2-bis(4-aminophenyl)-1,1,1,3,3 3-hexafluoropropane.

The polyphenol compounds include phenol novolak, o-cresol novolak, t-butylphenol novolak, dicyclopentadiene cresol, terpene diphenol, terpene dicatechol, 1,1,3-tris(3-t-butyl-4-hydroxy-6-methylphenyl)butane, butylidenebis(3-t-butyl-4-hydroxy-6-methylphenyl), and 2,2-bis(4-hydroxyphenyl)-1,1,1,3,3,3-hexafluoropropane. Preferred of them is phenol novolak in view of the electrical characteristics and mechanical strength of the resulting cured product that are suited for use as laminates.

The cationic initiators are compounds which release, on energy ray irradiation, a substance inducing cationic polymerization. Double salts releasing a Lewis acid on energy ray irradiation which are onium salts and derivatives thereof are particularly preferred cationic initiators. Such compounds are typically exemplified by salts composed of a cation and an anion and represented by general formula $[A]^{m+}[B]^{m-}$.

The cation $[A]^{m+}$ is preferably an onium ion, the structure of which can be presented by, for example, general formula $[(R^1)_a Q]^{m+}$, wherein $R^1$ represents an organic group having 1 to 60 carbon atoms which may contain any number of atoms other than carbon; a represents an integer of 1 to 5; $aR^1$'s is each independent may be the same or different; at least one of $aR^1$'s and preferably contains an aromatic ring; Q represents an atom or an atomic group selected from the group consisting of S, N, Se, Te, P, As, Sb, Bi, O, I, Br, Cl, F, and N≡N. The atomic valence of Q in general formula $[(R^1)_a Q]^{m+}$ representing the cation $[A]^{m+}$ being taken as q, the formula must satisfy the relation: m=a−q (the atomic valence of N≡N is regarded to be 0).

The anion $[B]^{m-}$ is preferably a halide complex ion, the structure of which can be represented by, for example, general formula $[LX_b]^{m-}$, wherein L represents a metal or a metalloid as a center atom of the halide complex, e.g., B, P, As, Sb, Fe, Sn, Bi, Al, Ca, In, Ti, Zn, Sc, V, Cr, Mn or Co; X represents a halogen atom; and b represents an integer of 3 to 7. The atomic valence of L in general formula $[LX_b]^{m-}$ representing the anion $[B]^{m-}$ being taken as p, the formula must satisfy the relation: m=b−p.

Examples of the anion represented by general formula $[LX_b]^{m-}$ include a tetrafluoroborate anion $(BF_4)^-$, a hexafluorophosphate anion $(PF_6)^-$, a hexafluoroantimonate anion $(SbF_6)^-$, a hexafluoroarsenate anion $(AsF_6)^-$, and a hexachloroantimonate anion $(SbCl_6)^-$.

A structure represented by general structure: $[LX_{b-1}(OH)]^{m-}$ is also preferred as the anion $[B]^{m-}$, wherein L, X, and b are as defined in general formula $[LX_b]^{m-}$. Further included in the anion $[B]^{m-}$ are a perchlorate ion $(ClO_4)^-$, a trifluoromethylsulfite ion $(CF_3SO_3)^-$, a fluorosulfonate ion $(FSO_3)^-$, a toluenesulfonate anion, and a trinitrobenzenesulfonate anion.

Of the above-described onium salts it is particularly effective to use the following aromatic onium salts (a) to (c). These compounds can be used either individually or as a mixture of two or more thereof. (a) Aryldiazonium salts including phenyldiazonium hexafluorophosphate, 4-methoxyphenyldiazonium hexafluoroantimonate, and 4-methylphenyldiazonium hexafluorophosphate.

(b) Diaryliodonium salts including diphenyliodonium hexafluoroantimonate, di(4-methylphenyl)iodonium hexafluorophosphate, and di(4-tert-butylphenyl)iodonium hexafluorophosphate.

(c) Triarylsulfonium salts including triphenylsulfonium hexafluoroantimonate, tris(4-methoxyphenyl)sulfonium hexafluorophosphate, diphenyl-4-thiophenoxyphenylsulfonium hexafluoroantimonate, diphenyl-4-thiophenoxyphenylsulfonium hexafluorophosphat, 4,4'-bis(diphenylsulfonio)phenylsulfide-bis(hexafluoroantimonate), 4,4'-bis(diphenylsulfonio)phenylsulfide-bis(hexafluorophosphate), 4,4'-bis[di(β-hydroxyethoxy)phenylsulfonio]phenylsulfide-bis(hexafluoroantimonate), 4,4'-bis[di(β-hydroxyethoxy)phenylsulfonio]phenylsulfide-bis(hexafluorophosphate), 4-[4'-(benzoyl)phenylthio]phenyl-di(4-fluorophenyl)sulfonium hexafluoroantimonate, and 4-[4'-(benzoyl)phenylthio]phenyl-di(4-fluorophenyl)sulfonium hexafluorophosphate.

In addition to the compounds (a) to (c), also preferred are iron arene complexes, such as $(\eta^5$-2,4-cyclopentadien-1-yl)[(1,2,3,4,5,6-$\eta$)-(1-methylethyl)benzene]iron hexafluorophosphate, and mixtures of an aluminum complex, such as tris(acetylacetonato)aluminum, tris(ethylacetonatoacetato) aluminum or tris(salicylaldehydo)aluminum, and a silanol, such as triphenylsilanol.

Especially preferred of the recited compounds are aromatic iodonium salts, aromatic sulfonium salts, and iron arene complexes from the standpoint of practical utility and photo sensitivity.

The photo initiator may be used in combination with one or more known photo polymerization accelerators such as benzoic acid compounds and tertiary amine compounds. The photo initiator is preferably used in an amount of 0.1% to 30% by weight based on the vinyl ether curing composition of the invention. Amounts less than 0.1% by weight can fail to produce effect of addition. Amounts more than 30% by weight can result in reduction of mechanical strength of a cured product.

Known light sources, such as a high pressure mercury lamp, a metal halide lamp, and a xenon lamp, can be used in the polymerization using the photo initiator. Irradiation with active energy rays, such as ultraviolet rays, electron beams, X-rays, radial rays, and radiofrequency waves using these light sources causes the photo initiator to release a Lewis acid, whereby the polyepoxy compound is cured. Light sources having a wavelength of 400 nm or shorter are effective.

The vinyl ether curing composition of the invention composed of the polyfunctional vinyl ether compound and the polyhydric phenol compound can be cured by heat curing similarly to conventionally known epoxy resins. Where the polyepoxy compound is used in combination, known techniques relating to epoxy resin curing can be applied, including curing with a curing agent such as an amine curing agent or an acid anhydride curing agent, curing by self-polymerization using a curing catalyst, photo curing using a photo initiator, and curing rate control by a combined use of a cure accelerator.

The kind and the amount of the polyepoxy compound are selected as appropriate for the intended use of a cured product. Because the polyhydric phenol compound functions as a curing agent for both the polyfunctional vinyl ether compound and the polyepoxy compound, the amount of the polyepoxy compound is preferably selected from the range of 5% to 100% by weight, still preferably 10% to 50% by weight, even still preferably 10% to 30% by weight, based on the polyfunctional vinyl ether compound as long as the advantage of low dielectric constant attributed to the use of the polyfunctional vinyl ether compound is assured.

The amount of the epoxy resin curing agent to be used is not particularly limited but is usually such that the ratio of the total number of moles of epoxy groups to the number of functional groups of the epoxy resin curing agent ranges from 0.9/1.0 to 1.0/0.9. Where the epoxy resin curing agent also reacts with the polyhydric phenol compound to become a cured product, part of the polyfunctional vinyl ether compound may be displaced with the epoxy resin curing agent as long as the amount of the polyhydric phenol compound falls within a range of from 30 to 200 parts by weight per 100 parts by weight of the polyfunctional vinyl ether compound.

The filler that is preferably used in the vinyl ether curing composition of the invention includes fibrous fillers, such as glass fiber, aluminum borate whisker, and boron nitride whisker, and spherical fillers, such as silica and alumina. It is preferred to select the longer axis length and the aspect ratio of the fibrous filler as appropriate for the intended use. The spherical filler preferably has a true spherical shape with a small diameter.

The amount of the filler to be used is preferably 10 to 3000 parts by weight, still preferably 20 to 200 parts by weight, per 100 parts by weight of the polyfunctional vinyl ether compound. In using silica as a filler, for example, the amount is preferably 10 to 1000 parts by weight, still preferably 20 to 100 parts by weight, per 100 parts by weight of the total amount of the polyfunctional vinyl ether compound and the polyhydric phenol compound.

The flame retardant that can be used in the vinyl ether curing composition of the invention includes, but is not limited to, halogen-based ones, phosphorus-based ones, and inorganic ones. Preferred of them are phosphorus-based flame retardants because of the least effect on the environment. The compound represented by formula (II) shown supra, which has reactivity with an epoxy compound, etc., is particularly preferred because of the least adverse effect on the mechanical properties of the resin such as the glass transition temperature.

The amount of the flame retardant to be added is preferably 10 to 200 parts by weight, still preferably 10 to 100 parts by weight, per 100 parts by weight of the polyfunctional vinyl ether compound. In using the phosphorus-based flame retardant, in particular, the amount to be added is preferably 10 to 50 parts by weight, still preferably 10 to 30 parts by weight, per 100 parts by weight of the total amount of the polyfunctional vinyl ether compound and the polyhydric phenol compound.

The recited flame retardants may be used either individually or as a combination of two or more thereof. The flame retardants may be used in combination with non-dripping agents, such as polytetrafluoroethylene and polysiloxane, and flame retardant aids, such as antimony compounds and melamines.

EXAMPLES

The present invention will now be illustrated in greater detail with reference to Examples and Comparative Example, but it should be understood that the present invention is not construed as being limited thereto.

Examples 1 to 5 and Comparative Example 1

Curing compositions were prepared in accordance with the formulations shown in Table 1 below. Each of the resulting curing compositions was maintained at 180° C. for 1 hour, then at 200° C. for 1 hour, and finally at 220° C. for 1 hour to give a cured product. The performance properties (glass transition temperature, dielectric constant, dielectric loss tangent, water absorption, and flame retardance) of the resulting cured product were measured in accordance with the following methods of measurement. The flame retardant was used in an amount to give a phosphorus content of 1% by weight in the final curing composition.

Methods of Measurement:

The glass transition temperature was measured by a dynamic viscoelasticity method.

The dielectric constant and the dielectric loss tangent were measured with a material analyzer HP-4291B (from Agilent Technology).

The water absorption was measured by immersing a sample in distilled water at room temperature for 24 hours. The percentage of weight gain due to the immersion was taken as a water absorption.

The flame retardance was evaluated by UL-94.

The results of measurement of glass transition temperature (Tg), dielectric constant, dielectric loss tangent, and water absorption are shown in Table 1. All the test specimens were graded V-0 in the flame retardance test.

TABLE 1

| | Example | | | | | Comp. |
|---|---|---|---|---|---|---|
| | 1 | 2 | 3 | 4 | 5 | Ex. 1 |
| Polyfunctional Vinyl Ether Compound: | | | | | | |
| Compound No. 1 | 100 | | | | | |
| Compound No. 2 | | 100 | | | | |
| Compound No. 3 | | | 100 | | | |
| Compound No. 4 | | | | 100 | | |
| Compound No. 5 | | | | | 100 | |
| Epoxy Compound: | | | | | | |
| Comparative Compound 1[*1] | | | | | | 100 |
| Polyhydric Phenol Compound: | | | | | | |
| Phenol 1[*2] | 62.1 | 32.0 | 143 | 74.2 | | 30.9 |
| Phenol 2[*3] | 62.1 | 32.0 | | | 126.7 | 30.9 |
| Amorphous Silica[*4] | 12.4 | 9.1 | 13.5 | 9.7 | 12.6 | 9.0 |
| Spherical Silica[*5] | 37.3 | 27.3 | 40.4 | 29.0 | 37.7 | 26.9 |
| Flame Retardants[*6] | 24.3 | 17.9 | 26.2 | 18.9 | 24.6 | 17.5 |
| Solvent[*7] | 100 | 100 | 100 | 200 | 200 | 100 |
| Curing Catalyst[*8] | 7.1 | 3.8 | 10.1 | 5.4 | 5.6 | 3.7 |
| Tg (° C.) | 125 | 135 | 210 | 200 | 180 | 130 |
| Dielectric Constant (2 GHz) | 2.9 | 3.0 | 2.8 | 2.9 | 2.8 | 3.5 |

TABLE 1-continued

| | Example | | | | | Comp. |
|---|---|---|---|---|---|---|
| | 1 | 2 | 3 | 4 | 5 | Ex. 1 |
| Dielectric Loss Tangent (2 GHz) | 0.009 | 0.010 | 0.008 | 0.007 | 0.006 | 0.200 |
| Water Absorption (wt %) | 0.25 | 0.20 | 0.30 | 0.20 | 0.15 | 1.50 |

Note
*[1]Bisphenol A diglycidyl ether
*[2]PR-53194 (from Sumitomo Bakelite Co., Ltd.)
*[3]Milex XLC-LL (from Mitsui Chemicals, Inc.)
*[4]Aerosil 200 (from Nippon Aerosil Co., Ltd.)
*[5]SO-E5 (from Admatechs Co., Ltd.)
*[6]
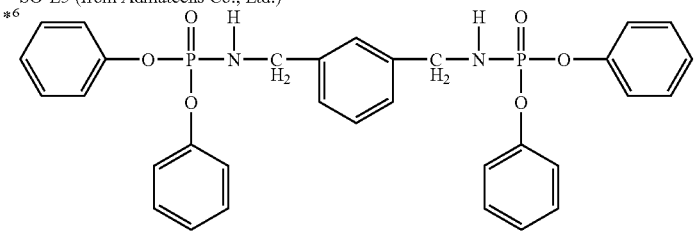

*[7]Ethylene glycol butyl ether acetate
*[8]2-Ethyl-4-methylimidazole

It is apparent that the cured products obtained from the vinyl ether curing compositions comprising the polyfunctional vinyl ether compound and the polyhydric phenol compound (Examples 1 to 5) have a lower dielectric constant, a smaller dielectric loss tangent, and a lower water absorption than the cured product obtained from the epoxy resin curing composition (Comparative Example 1), proving that the vinyl ether curing composition of the invention to be suited for use as electronic components such as laminates. Where in using a tetra- or higher functional vinyl ether compound as the polyfunctional vinyl ether compound (Examples 3 to 5), the resulting cured product has a high glass transition temperature and therefore exhibits further improved mechanical characteristics as well as the excellent electrical characteristics.

The invention claimed is:

1. A vinyl ether curing composition, comprising:
   a polyfunctional vinyl ether compound;
   a polyhydric phenol compound; and
   a flame retardant,
   wherein the composition contains 10 to 30 parts by weight of a phosphorus-based flame retardant as the flame retardant per 100 parts by weight of the total of the polyfunctional vinyl ether compound and the polyhydric phenol compound,
   and the polyfunctional vinyl ether compound is Compound No. 1, Compound No. 3, Compound No. 4 or Compound No. 5 where n' is 1 to 10,000:

Compound No. 1:

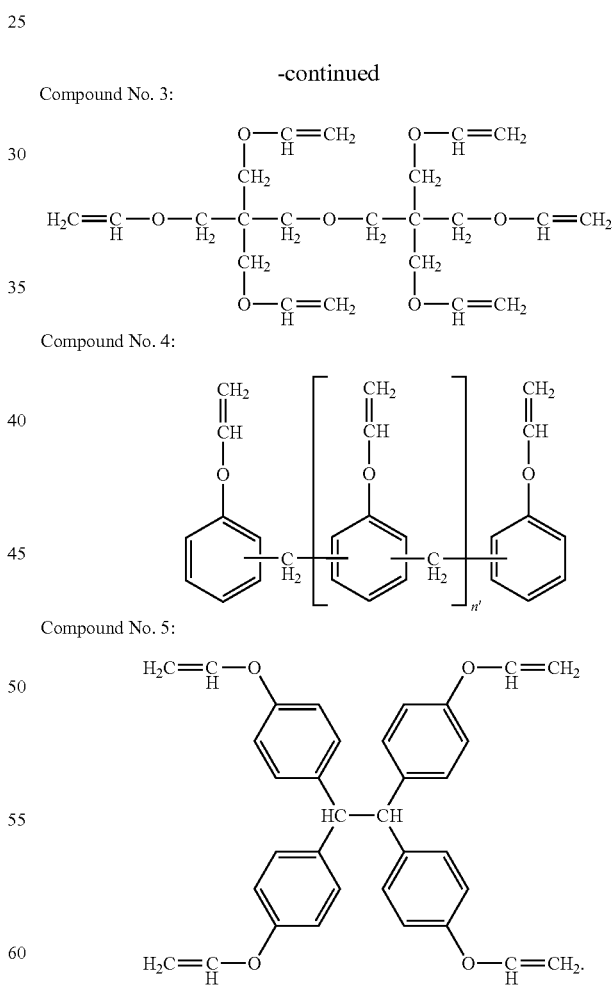

2. The vinyl ether curing composition according to claim 1, wherein the composition contains 30 to 200 parts by weight of the polyhydric phenol compound per 100 parts per weight of the polyfunctional vinyl ether compound.

3. The vinyl ether curing composition according to claim 1, wherein the polyfunctional vinyl ether compound is a tetra- or higher functional vinyl ether compound.

4. The vinyl ether curing composition according to claim 1, wherein the polyhydric phenol compound is a phenol resin represented by general formula (I):

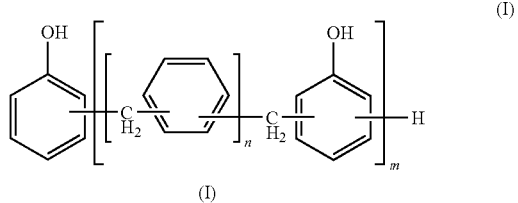

wherein n represents 0 or 1; and m represents a number of from 1 to 10000.

5. The vinyl ether curing composition according to claim 1, containing 10 to 1000 parts by weight of silica as the filler per 100 parts by weight of the total of the polyfunctional vinyl ether compound and the polyhydric phenol compound.

6. The vinyl ether curing composition according to claim 1, wherein the phosphorus-based flame retardant is a compound represented by formula (II):

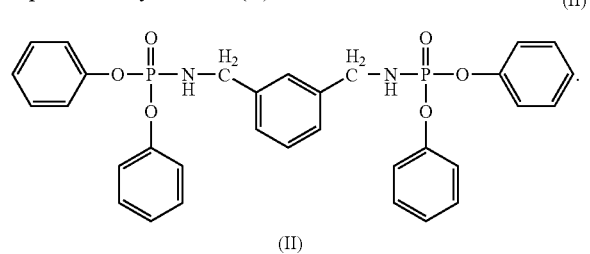

7. The vinyl ether curing composition according to claim 1, further comprising a polyepoxy compound.

8. A prepreg formed by using the vinyl ether curing composition according to claim 1.

9. The vinyl ether curing composition according to claim 2, wherein the polyfunctional vinyl ether compound is a tetra- or higher functional vinyl ether compound.

10. The vinyl ether curing composition according to claim 2, wherein the polyhydric phenol compound is a phenol resin represented by general formula (I):

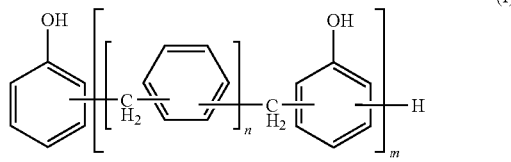

wherein n represents 0 or 1; and m represents a number of from 1 to 10000.

11. The vinyl ether curing composition according to claim 3, wherein the polyhydric phenol compound is a phenol resin represented by general formula (I):

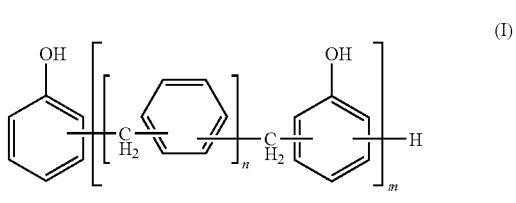

wherein n represents 0 or 1; and m represents a number of from 1 to 10000.

12. The vinyl ether curing composition according to claim 2, containing 10 to 1000 parts by weight of silica as the filler per 100 parts by weight of the total of the polyfunctional vinyl ether compound and the polyhydric phenol compound.

13. The vinyl ether curing composition according to claim 3, containing 10 to 1000 parts by weight of silica as the filler per 100 parts by weight of the total of the polyfunctional vinyl ether compound and the polyhydric phenol compound.

14. The vinyl ether curing composition according to claim 4, containing 10 to 1000 parts by weight of silica as the filler per 100 parts by weight of the total of the polyfunctional vinyl ether compound and the polyhydric phenol compound.

15. The vinyl ether curing composition according to claim 2, wherein the phosphorus-based flame retardant is a compound represented by formula (II):

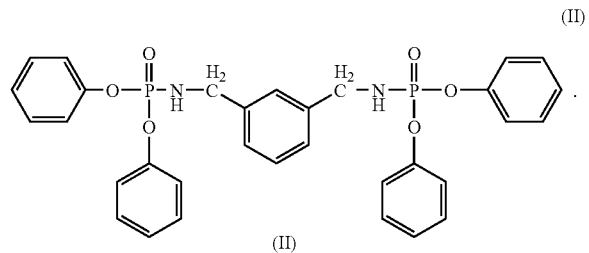

* * * * *